(12) United States Patent
Park et al.

(10) Patent No.: US 12,308,231 B1
(45) Date of Patent: May 20, 2025

(54) METHOD FOR CONTROLLING SURFACE CHARACTERISTICS AND THICKNESS OF MULTILAYER TRANSITION METAL DICHALCOGENIDE THIN FILM

(71) Applicant: INDUSTRY-ACADEMIC COOPERATION FOUNDATION GYEONGSANG NATIONAL UNIVERSITY, Jinju-si (KR)

(72) Inventors: Jun Hong Park, Jinju-si (KR); Chang Hwan Oh, Jeollanam-do (KR)

(73) Assignee: INDUSTRY-ACADEMIC COOPERATION FOUNDATION GYEONGSANG NATIONAL UNIVERSITY, Jinju-si (KR)

( * ) Notice: Subject to any disclaimer, the term of this patent is extended or adjusted under 35 U.S.C. 154(b) by 0 days.

(21) Appl. No.: 18/879,209

(22) PCT Filed: Aug. 18, 2023

(86) PCT No.: PCT/KR2023/012271
§ 371 (c)(1),
(2) Date: Dec. 26, 2024

(87) PCT Pub. No.: WO2024/043625
PCT Pub. Date: Feb. 29, 2024

(30) Foreign Application Priority Data

Aug. 24, 2022 (KR) .......... 10-2022-0105943

(51) Int. Cl.
*H01L 21/02* (2006.01)
*H01L 21/465* (2006.01)
(Continued)

(52) U.S. Cl.
CPC .. *H01L 21/02568* (2013.01); *H01L 21/02417* (2013.01); *H01L 21/02485* (2013.01);
(Continued)

(58) Field of Classification Search
CPC ......... H01L 21/02403; H01L 21/02417; H01L 21/02472; H01L 21/02485;
(Continued)

(56) References Cited

U.S. PATENT DOCUMENTS

| 6,358,316 B1 | 3/2002 | Kizuki et al. |
| 9,231,148 B2 | 1/2016 | Buffiere et al. |
| 11,024,759 B2 * | 6/2021 | Choi ............ H10D 62/80 |

FOREIGN PATENT DOCUMENTS

| JP | H11283959 A | 10/1999 |
| JP | 2021169663 A | 10/2021 |

(Continued)

*Primary Examiner* — Cheung Lee
(74) *Attorney, Agent, or Firm* — Bridgeway IP Law Group, PLLC; Jihun Kim

(57) ABSTRACT

An embodiment relates to a method for controlling the surface characteristics and thickness of a multilayer transition metal dichalcogenide thin film. By forming an amorphous transition metal oxide thin film on a multilayer transition metal dichalcogenide thin film, and then treating the multilayer transition metal dichalcogenide thin film having the amorphous transition metal oxide thin film formed thereon with an aqueous solution of ammonium sulfide at least once, the surface characteristics and thickness of the transition metal dichalcogenide can be controlled in a simple and low-cost manner without complex equipment settings for heat treatment, plasma and laser etching, and so on.

14 Claims, 7 Drawing Sheets

(51) Int. Cl.
*H10D 10/80* (2025.01)
*H10D 62/80* (2025.01)

(52) U.S. Cl.
CPC ...... *H01L 21/02581* (2013.01); *H01L 21/465* (2013.01); *H10D 10/80* (2025.01); *H10D 62/883* (2025.01)

(58) Field of Classification Search
CPC ......... H01L 21/02505; H01L 21/02554; H01L 21/02565; H01L 21/02568; H01L 21/02581; H01L 21/461; H01L 21/465; H10D 10/021; H10D 10/031; H10D 10/80; H10D 62/80; H10D 62/871; H10D 62/874; H10D 62/883
See application file for complete search history.

(56) References Cited

FOREIGN PATENT DOCUMENTS

| | | |
|---|---|---|
| KR | 10-1348059 B1 | 1/2014 |
| KR | 10-2016-0098322 A | 8/2016 |
| KR | 10-2017-0056386 A | 5/2017 |
| KR | 10-2017-0098053 A | 8/2017 |
| KR | 10-2018-0002925 A | 1/2018 |
| KR | 101927579 B1 | 12/2018 |

\* cited by examiner

METHOD FOR CONTROLLING SURFACE CHARACTERISTICS AND THICKNESS OF MULTILAYER TRANSITION METAL DICHALCOGENIDE THIN FILM

TECHNICAL FIELD

The present invention relates to methods for controlling the surface properties and thickness of a multilayer transition metal dichalcogenide thin film, and more specifically, to methods for controlling the surface properties and thickness of a multilayer transition metal dichalcogenide thin film, which may improve the performance of a semiconductor material in a simple and low-cost manner by forming an amorphous transition metal oxide thin film on the multilayer transition metal dichalcogenide thin film, and then treating the multilayer transition metal dichalcogenide thin film, which has the amorphous transition metal oxide thin film formed thereon, at least once with an aqueous ammonium sulfide solution.

BACKGROUND ART

Two-dimensional materials are chemically stable because they have a structure in which strong covalent bonds are formed within a single layer and layers are bonded by relatively weak van der Waals forces.

Two-dimensional (2D) transition metal dichalcogenide (TMD) materials, such as molybdenum diselenide ($MoSe_2$), molybdenum disulfide ($MoS_2$), and molybdenum ditelluride ($MoTe_2$), have been widely used in next-generation electronic and optoelectronic devices such as chemical sensors, memory devices, batteries, phototransistors, and photodetectors due to their excellent physical, electronic, and mechanical properties.

The transition metal dichalcogenide materials have the structure $MX_2$ (M: a transition metal, X: a chalcogenide), and are materials in which a transition metal from group 4 to group 10 is covalently bonded with two chalcogen atoms. These transition metal dichalcogenides exhibit distinct differences in stability and properties depending on the single-lattice structure, and shows semiconductor properties in the trigonal prismatic structure and metallic properties in the octahedral structure.

Transition metal dichalcogenides with the above-described properties have attracted great interest in various research fields. In particular, solution-processable transition metal dichalcogenides have emerged as a new class of materials that are suitable for a wide range of applications in optoelectronics, energy devices, and bio-applications, and exhibit remarkable electrical and catalytic properties, as well as metallic properties.

In order to utilize transition metal dichalcogenides in various application fields, the surface properties and thickness thereof are controlled using heat treatment, plasma, and laser etching techniques. However, these techniques require complex system settings, and therefore, there is a need to develop methods capable of controlling the surface properties and thickness of transition metal dichalcogenides in a simpler and lower-cost manner.

DISCLOSURE

Technical Problem

The technical problem to be solved by the present invention is to provide methods for controlling the surface properties and thickness of a multilayer transition metal dichalcogenide thin film, which may improve the performance of a semiconductor material in a simple and low-cost manner by forming an amorphous transition metal oxide thin film on the multilayer transition metal dichalcogenide thin film, and then treating the multilayer transition metal dichalcogenide thin film, which has the amorphous transition metal oxide thin film formed thereon, at least once with an aqueous ammonium sulfide solution.

The technical problems of the present invention are not limited to the technical problems mentioned above, and other technical problems not mentioned above will be clearly understood by those skilled in the art from the following description.

Technical Solution

According to one embodiment of the present invention for achieving the technical problem, there is provided a method for controlling the surface properties of a multilayer transition metal dichalcogenide thin film, comprising: step (S10) of forming the multilayer transition metal dichalcogenide thin film on a substrate using a transition metal chalcogenide; step (S20) of forming an amorphous transition metal oxide thin film on the multilayer transition metal dichalcogenide thin film; and step (S30) of treating the multilayer transition metal dichalcogenide thin film, which has the amorphous transition metal oxide thin film formed thereon, with an aqueous ammonium sulfide solution.

According to one embodiment of the present invention, in step S10, the transition metal chalcogenide may be any one of molybdenum diselenide ($MoSe_2$), molybdenum disulfide ($MoS_2$), and molybdenum ditelluride ($MoTe_2$).

According to one embodiment of the present invention, the transition metal chalcogenide may be molybdenum diselenide ($MoSe_2$).

According to one embodiment of the present invention, in step S20, the amorphous transition metal oxide thin film may be formed by oxidizing the multilayer transition metal dichalcogenide thin film.

According to one embodiment of the present invention, the amorphous transition metal oxide thin film may be formed by oxidizing the multilayer transition metal dichalcogenide thin film using an oxygen plasma oxidation method.

According to one embodiment of the present invention, in step S30, the multilayer transition metal dichalcogenide thin film, which has the amorphous transition metal oxide thin film formed thereon, may be immersed in the aqueous ammonium sulfide solution.

According to another embodiment of the present invention for achieving the technical problem, there is provided a method for controlling the thickness of a multilayer transition metal dichalcogenide thin film, comprising: step (S100) of forming the multilayer transition metal dichalcogenide thin film on a substrate using a transition metal chalcogenide; step (S200) of forming an amorphous transition metal oxide thin film on the multilayer transition metal dichalcogenide thin film; step (S300) of subjecting the multilayer transition metal dichalcogenide thin film, which has the amorphous transition metal oxide thin film formed thereon, to a first treatment with an aqueous ammonium sulfide solution; and step (S400) of subjecting the multilayer transition metal dichalcogenide thin film, subjected to the first treatment, to a second treatment with the aqueous ammonium sulfide solution.

According to another embodiment of the present invention, in step S100, the transition metal chalcogenide may be any one of molybdenum diselenide ($MoSe_2$), molybdenum disulfide ($MoS_2$), and molybdenum ditelluride ($MoTe_2$).

According to another embodiment of the present invention, the transition metal chalcogenide may be molybdenum diselenide ($MoSe_2$).

According to another embodiment of the present invention, in step S200, the amorphous transition metal oxide thin film may be formed by oxidizing the multilayer transition metal dichalcogenide thin film.

According to another embodiment of the present invention, the amorphous transition metal oxide thin film may be formed by oxidizing the multilayer transition metal dichalcogenide thin film using an oxygen plasma oxidation method.

According to another embodiment of the present invention, in step S300, the multilayer transition metal dichalcogenide thin film, which has the amorphous transition metal oxide thin film formed thereon, may be immersed in the aqueous ammonium sulfide solution.

According to another embodiment of the present invention, in step S400, the multilayer transition metal dichalcogenide thin film subjected to the first treatment may be immersed in the aqueous ammonium sulfide solution.

According to another embodiment of the present invention, the time of the second treatment in step S400 may be longer than the time of the first treatment in step S300.

Advantageous Effects

According to the present invention as described above, it is possible to control the surface properties and thickness of a transition metal dichalcogenide in a simple and low-cost manner without complex system settings for heat treatment, plasma treatment, laser etching, and the like by forming an amorphous transition metal oxide thin film on a multilayer transition metal dichalcogenide thin film, and then treating the multilayer transition metal dichalcogenide thin film, which has the amorphous transition metal oxide thin film formed thereon, with an aqueous ammonium sulfide solution.

In addition, according to the present invention as described above, when a multilayer transition metal dichalcogenide thin film having an amorphous transition metal oxide thin film formed thereon is to be used as a sensor active layer for detecting risk factors such as hydrogen, it is possible to increase the area for adsorption of the risk factor by controlling the flatness of the surface of the amorphous transition metal oxide thin film and forming nanostructures. Thus, the present invention may be used to control the specific surface area of the sensor active layer.

In addition, according to the present invention as described above, when a multilayer transition metal dichalcogenide thin film is to be used as a semiconductor element, it is possible to make the thickness of the thin film uniform and control the number of layers, thereby improving the characteristics of the semiconductor element.

The effects of the present invention are not limited to the effects mentioned above, and other effects not mentioned above will be clearly understood by those skilled in the art from the following description.

MODE FOR INVENTION

Figure 1:
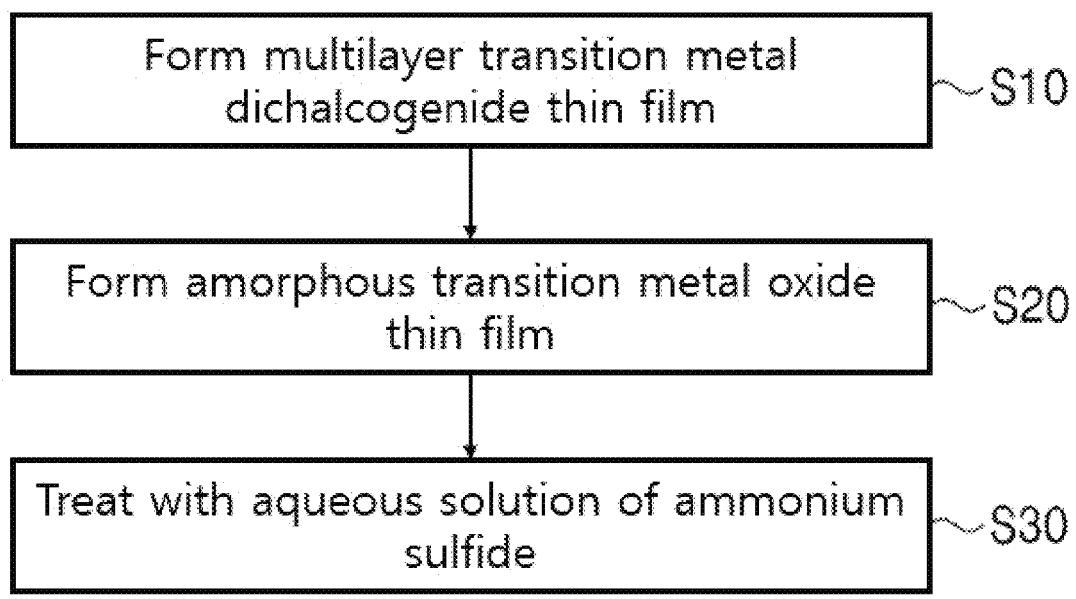
FIG. 1 is a process flow chart showing a method for controlling the surface properties of a multilayer transition metal dichalcogenide thin film according to one embodiment of the present invention.

The advantages and features of the present invention, and the way of attaining them, will become apparent with reference to the embodiments described in detail below in conjunction with the accompanying drawings. The present invention may, however, be embodied in different forms and should not be construed as limited to the embodiments disclosed below. Rather, these embodiments are provided so that this disclosure will be thorough and complete, and will fully convey the scope of the present invention to those skilled in the art. The scope of the present invention will be defined by the appended claims. Accordingly, in some embodiments, well-known process steps, well-known device structures and well-known techniques are not described in detail in order to avoid obscuring the present invention. Like reference numerals refer to like elements throughout the specification.

Terms used in the present specification are for the purpose of describing embodiments and are not intended to limit the present invention. In the present specification, singular forms also include plural expressions unless specified otherwise in the context thereof. As used in the present specification, the terms "comprises" and/or "comprising" specify the presence of stated components, steps, operations and/or elements, but do not preclude the presence or addition of one or more other components, steps, operations and/or elements.

Identification symbols for individual steps are used for the convenience of explanation. The identification symbols are not intended to describe the operation order of the steps. Therefore, unless otherwise explicitly indicated in the context, the steps may be performed differently from the stated order. In other words, the respective steps may be performed in the same order as the stated order, or performed substantially at the same time, or performed in an order opposite to the stated order.

Unless otherwise defined, all terms (including technical and scientific terms) used in the present specification have the same meaning as commonly understood by those skilled in the art in the art to which the present invention pertains. In addition, terms, such as those defined in commonly used dictionaries, should not be interpreted as having ideal or excessively formative meanings, unless expressly defined herein.

According to one preferred embodiment of the present invention, there is provided a method for controlling the surface properties of a multilayer transition metal dichalcogenide thin film, comprising: step (S10) of forming the multilayer transition metal dichalcogenide thin film on a substrate using a transition metal chalcogenide; step (S20) of forming an amorphous transition metal oxide thin film on the multilayer transition metal dichalcogenide thin film; and step (S30) of treating the multilayer transition metal dichalcogenide thin film, which has the amorphous transition metal oxide thin film formed thereon, with an aqueous ammonium sulfide solution.

Figure 2:
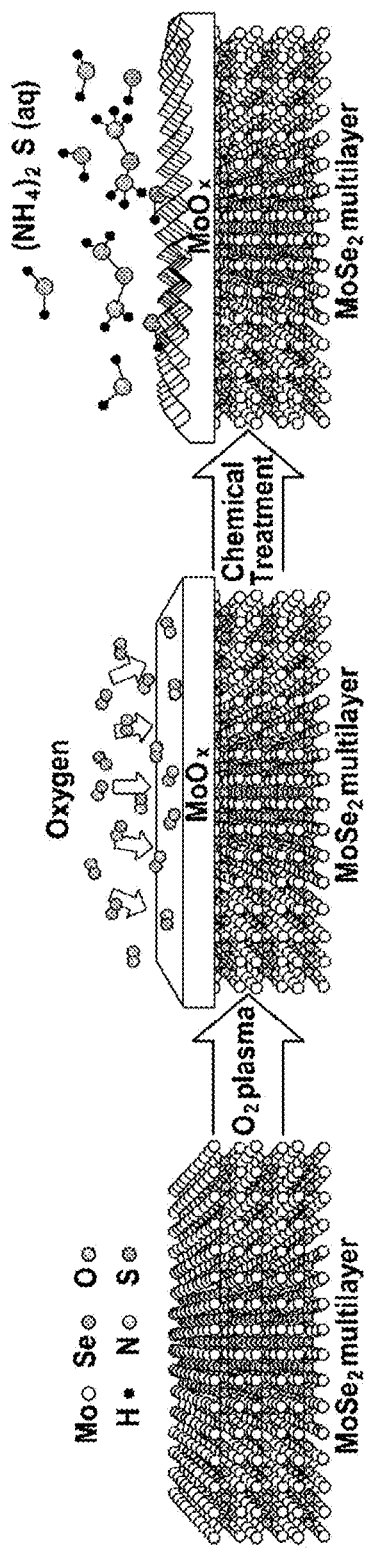
FIG. 2 is a schematic view showing a method for controlling the surface properties of a multilayer transition metal dichalcogenide thin film according to one embodiment of the present invention.

Hereinafter, a method for controlling the surface properties of a multilayer transition metal dichalcogenide thin film according to the present invention will be described in detail with reference to a process flow chart shown in FIG. 1 and a schematic view shown in FIG. 2.

First, a multilayer transition metal dichalcogenide thin film is formed on a substrate using a transition metal chalcogenide (S10).

Transition metal chalcogenides are two-dimensional materials that can replace graphene. In principle, they perform only a two-dimensional interaction with constituent atoms. Accordingly, the transport of carriers in transition metal dichalcogenides exhibits a ballistic transport pattern, unlike conventional thin films or bulks, thereby realizing high mobility, high speed, and low power characteristics.

The transition metal chalcogenide may be any one of molybdenum diselenide ($MoSe_2$), molybdenum disulfide ($MoS_2$), and molybdenum ditelluride ($MoTe_2$), and is preferably molybdenum diselenide ($MoSe_2$). However, the present invention is not limited thereto, and the transition metal of the transition metal chalcogenide may be replaced with tungsten (W), tin (Sn), rhenium (Re), tantalum (Ta), titanium (Ti), or the like, as long as it is possible to form a volatile chalcogen with a 2H crystal structure.

According to one embodiment of the present invention, a method of forming the multilayer transition metal dichalcogenide thin film on the substrate using the transition metal chalcogenide may be performed using various methods such as a Scotch tape peeling method, a chemical vapor deposition (CVD) method, a physical vapor deposition (PVD) method, a plasma-enhanced chemical vapor deposition (PECVD) method, an atomic layer deposition (ALD) method, and a growth method using a solution (solution process), without being limited thereto.

The substrate may be a silicon (Si) substrate, but is not limited thereto and various substrates such as a ceramic substrate may be used.

Next, an amorphous transition metal oxide thin film is formed on the multilayer transition metal dichalcogenide thin film (S20).

"Amorphous" refers to a state in which a solid material has a uniform composition, but the atoms are arranged in a disordered manner, like a liquid, and do not form a regular lattice.

According to one embodiment of the present invention, the amorphous transition metal oxide thin film may be formed by oxidizing the multilayer transition metal dichalcogenide thin film. As a method for oxidizing the multilayer transition metal dichalcogenide thin film, an oxygen plasma method is preferably used in terms of process speed control and homogeneous oxide formation, but is not limited thereto and various oxidation methods such as dry thermal oxidation, wet thermal oxidation, and electrochemical oxidation may be used.

According to one embodiment of the present invention, the diffusion distance that accelerated oxygen atoms can penetrate into a transition metal chalcogenide crystal during oxygen plasma treatment is 3 nm or less, and thus the top surface of the multilayer transition metal dichalcogenide thin film is oxidized, so that the amorphous transition metal oxide thin film and the multilayer transition metal dichalcogenide thin film form a heterojunction structure.

For example, when the transition metal chalcogenide is molybdenum diselenide ($MoSe_2$), the top surface of the multilayer molybdenum diselenide ($MoSe_2$) thin film is oxidized, so that the molybdenum oxide ($MoO_x$) thin film and the multilayer molybdenum diselenide ($MoSe_2$) thin film form a $MoO_x/MoSe_2$ heterojunction structure.

Finally, the multilayer transition metal dichalcogenide thin film having the amorphous transition metal oxide thin film formed thereon is treated with an aqueous solution of ammonium sulfide (($NH_4)_2S$) (S30).

According to one embodiment of the present invention, a method of treating the multilayer transition metal dichalcogenide thin film having the amorphous transition metal oxide thin film formed thereon with an aqueous solution of ammonium sulfide (($NH_4)_2S$) is preferably a method of immersing the multilayer transition metal dichalcogenide thin film having the amorphous transition metal oxide thin film formed thereon in an aqueous solution of ammonium sulfide (($NH_4)_2S$) aqueous solution. However, the present invention is not limited thereto, and a method such as spraying may be used if process conditions capable of providing a sufficient reduction reaction within a homogeneous temperature environment are satisfied.

When the multilayer transition metal dichalcogenide thin film having the amorphous transition metal oxide thin film formed thereon is immersed in an aqueous solution of ammonium sulfide (($NH_4)_2S$), roughness may be imparted to the surface of the multilayer transition metal dichalcogenide thin film during the reduction reaction between ammonium sulfide (($NH_4)2_S$) and the amorphous transition metal oxide thin film. As the surface roughness of the multilayer transition metal dichalcogenide thin film is changed, the mobility of charges on the semiconductor surface and the degree of increase in current due to scattering at the surface are changed, whereby the surface properties of the multilayer transition metal dichalcogenide thin film may be controlled in a simple and low-cost manner.

According to one embodiment of the present invention, the degree of surface roughness may be controlled depending on the time period during which the multilayer transition metal dichalcogenide thin film having the amorphous transition metal oxide thin film formed thereon is immersed in an aqueous solution of ammonium sulfide (($NH_4)_2S$). The time of immersion for controlling the degree of surface roughness is preferably 1 to 600 seconds. If the time of immersion is shorter than 1 second, it is not sufficient to reach the initial reduction reaction, and if the time of immersion is longer than 600 seconds, the amorphous transition metal oxide thin film may be completely etched.

According to another preferred embodiment of the present invention, there is provided a method for controlling the thickness of a multilayer transition metal dichalcogenide thin film, comprising: step (S100) of forming the multilayer transition metal dichalcogenide thin film on a substrate using a transition metal chalcogenide; step (S200) of forming an amorphous transition metal oxide thin film on the multilayer transition metal dichalcogenide thin film; step (S300) of subjecting the multilayer transition metal dichalcogenide thin film, which has the amorphous transition metal oxide thin film formed thereon, to a first treatment with an aqueous ammonium sulfide solution; and step (S400) of subjecting the multilayer transition metal dichalcogenide thin film, subjected to the first treatment, to a second treatment with the aqueous ammonium sulfide solution.

Figure 3:
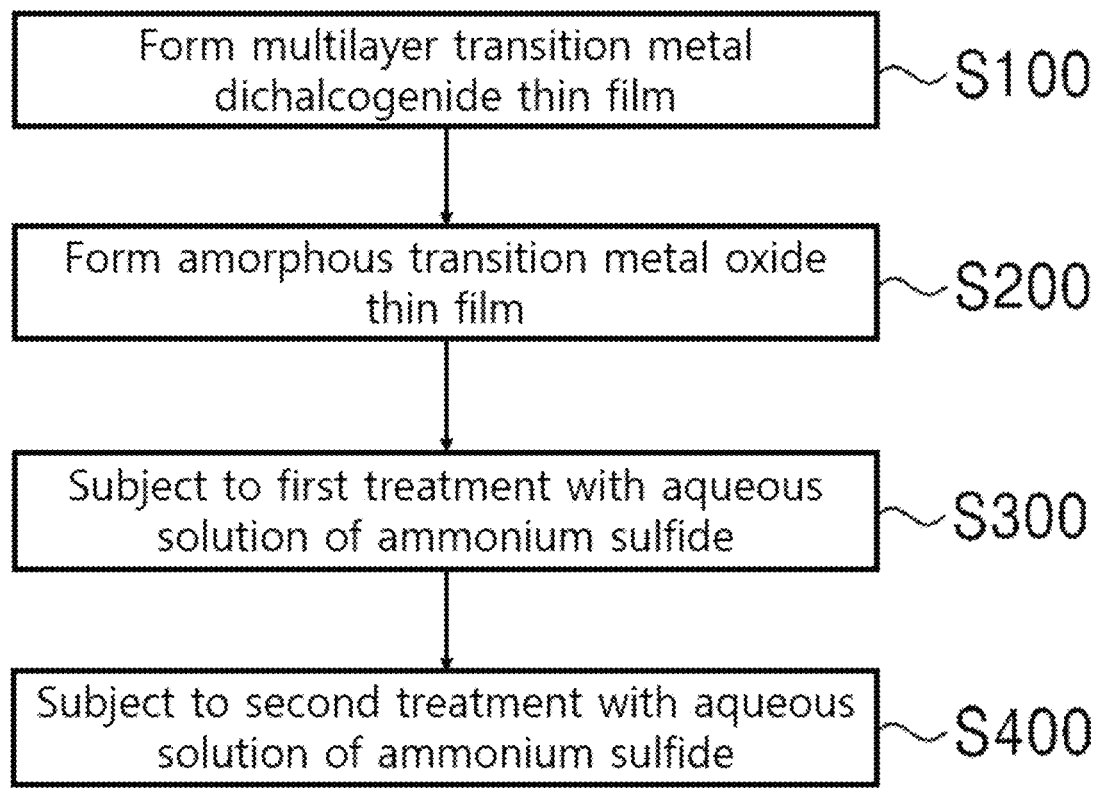
FIG. 3 is a process flow chart showing a method for controlling the thickness of a multilayer transition metal dichalcogenide thin film according to another embodiment of the present invention.

Hereinafter, the method for controlling the thickness of a multilayer transition metal dichalcogenide thin film according to the present invention will be described in detail with reference to the process flow diagram shown in FIG. 3.

First, a multilayer transition metal dichalcogenide thin film is formed on a substrate using a transition metal chalcogenide (S100).

The types of transition metal chalcogenide and substrate and the method for forming the multilayer transition metal dichalcogenide thin film on the substrate using the transition metal chalcogenide are identical to those in step S10 of the method for controlling the surface properties of a multilayer transition metal dichalcogenide thin film, and thus detailed description thereof will be omitted for the sake of brevity of the specification.

Next, an amorphous transition metal oxide thin film is formed on the multilayer transition metal dichalcogenide thin film (S200).

The method for forming the amorphous transition metal oxide thin film and the formation of the heterojunction structure by the amorphous transition metal oxide thin film and the multilayer transition metal dichalcogenide thin film are identical to those in step S20 of the method for controlling the surface properties of a multilayer transition metal dichalcogenide thin film, and detailed description thereof will be omitted for the sake of brevity of the specification Next, the multilayer transition metal dichalcogenide thin film having the amorphous transition metal oxide thin film formed thereon is subjected to a first treatment with an aqueous ammonium sulfide solution (S300). Finally, the multilayer transition metal dichalcogenide thin film subjected to the first treatment is subjected to a second treatment with an aqueous ammonium sulfide solution (S400).

According to another embodiment of the present invention, step (S300) of subjecting the multilayer transition metal dichalcogenide thin film having the amorphous transition metal oxide thin film formed thereon to the first treatment with the aqueous ammonium sulfide solution and step (S400) of subjecting the multilayer transition metal dichalcogenide thin film, subjected to the first treatment, to the second treatment with the aqueous ammonium sulfide solution may be performed sequentially. In this case, the second treatment step (S400) is preferably performed for a longer time than the first treatment step (S300). However, the present invention is not limited thereto, and the multilayer transition metal dichalcogenide thin film subjected to the first treatment may be subjected to an additional cleaning step, and then subjected to the second treatment with the aqueous ammonium sulfide solution.

According to another embodiment of the present invention, the method of subjecting the multilayer transition metal dichalcogenide thin film having the amorphous transition metal oxide thin film formed thereon to the first treatment with the aqueous ammonium sulfide $((NH_4)_2S)$ solution and the method of subjecting the multilayer transition metal dichalcogenide thin film, subjected to the first treatment, subjected to the second treatment with the aqueous ammonium sulfide $((NH_4)_2S)$ solution are preferably performed by a method of immersing the thin film in the aqueous ammonium sulfide $((NH_4)_2S)$ solution.

When the multilayer transition metal dichalcogenide thin film having the amorphous transition metal oxide thin film formed thereon is subjected to a first immersion in the aqueous ammonium sulfide solution, a reduction reaction occurs between the ammonium sulfide and the amorphous transition metal oxide thin film, and the amorphous transition metal oxide thin film is partially or completely removed depending on the time of the first immersion. Next, when the thin film is subjected to a second immersion in the aqueous ammonium sulfide solution, the thickness of the multilayer transition metal dichalcogenide film is reduced, and the thickness of the multilayer transition metal dichalcogenide film may be controlled depending on the time of the second immersion.

During the first immersion in the aqueous ammonium sulfide solution, the amorphous transition metal oxide thin film is partially or completely removed and at the same time, some of the oxygen atoms penetrate into the transition metal dichalcogenide thin film. Then, during the second immersion in the aqueous ammonium sulfide solution, a phenomenon occurs in which the oxygen atoms that have penetrated into the transition metal dichalcogenide thin film react with the ammonium sulfide aqueous solution, decomposing the surrounding transition metal dichalcogenide. As a result, the thickness of the transition metal dichalcogenide thin film that the oxygen atoms have penetrated is reduced, and the thickness of the multilayer transition metal dichalcogenide thin film may be controlled depending on the time of the second immersion in ammonium sulfide.

Hereinafter, examples of the methods for controlling the surface properties and thickness of a multilayer transition metal dichalcogenide thin film according to the present invention will be described. However, it should be understood that these examples are only the most preferred examples of the present invention and do not represent all of the technical spirits of the present invention, and thus there may be various equivalents and modifications capable of replacing them at the time of filing of the present invention.

Example 1: Control of Surface Properties of Multilayer Transition Metal Dichalcogenide Thin Film 1-1. Fabrication of Multilayer Molybdenum Diselenide $(MoSe_2)$ Thin Film Using a Scotch tape method, a multilayer molybdenum diselenide $(MoSe_2)$ thin film was formed on a 300-nm-thick silicon oxide $(SiO_2)$ substrate thermally growth on a p-type silicon (Si) substrate.

1-2. Oxygen Plasma Treatment of Multilayer Molybdenum Diselenide $(MoSe_2)$ Thin Film The multilayer molybdenum diselenide $(MoSe_2)$ thin film formed on the silicon oxide $(SiO_2)$ substrate was treated with oxygen plasma for about 20 minutes using a plasma generator (PDC-32G-2, Harrick plasma Inc.) under the conditions of power of 10.5 W, chamber pressure of 2.33 Torr, and oxygen flow rate of 60 sccm, thereby forming an amorphous molybdenum oxide $(MoO_x)$ layer on the multilayer molybdenum diselenide $(MoSe_2)$ thin film.

1-3. Immersion in Aqueous Ammonium Sulfide $((NH_4)_2S)$ Solution

The multilayer molybdenum diselenide $(MoSe_2)$ thin film having the amorphous molybdenum oxide $(MoO_x)$ layer formed thereon was immersed in an aqueous ammonium sulfide $((NH_4)_2S)$ solution (25% concentration) at 323 K for about 10 seconds.

1-4. Measurement Results

Optical images, AFM images, height profiles extracted from the AFM images, and Raman spectra of the bare multilayer molybdenum diselenide $(MoSe_2)$ thin film, the multilayer molybdenum diselenide $(MoSe_2)$ thin film after oxygen plasma treatment, and the multilayer molybdenum diselenide ($MoSe_2$) thin film after treatment by immersion in the aqueous ammonium sulfide were measured and compared.

Figure 4:
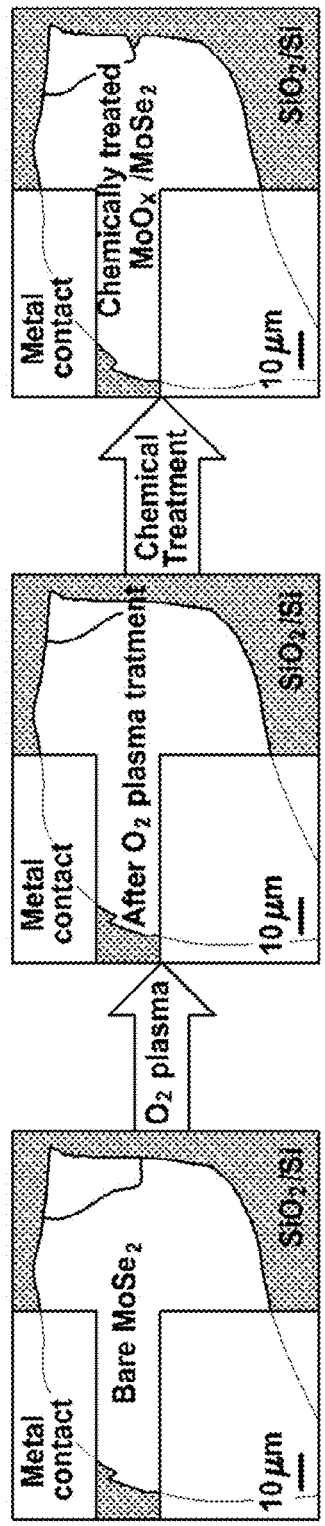
FIG. 4 shows optical images of Example 1.

Referring to FIG. 4, it can be seen that the initial morphology was maintained even after the oxidation reaction by oxygen plasma treatment of the multilayer molybdenum diselenide ($MoSe_2$) thin film and the reduction reaction by immersion in the aqueous ammonium sulfide solution, indicating that partial oxidation and reduction on the top layer of the multilayer molybdenum diselenide ($MoSe_2$) thin film were induced.

Figure 5:
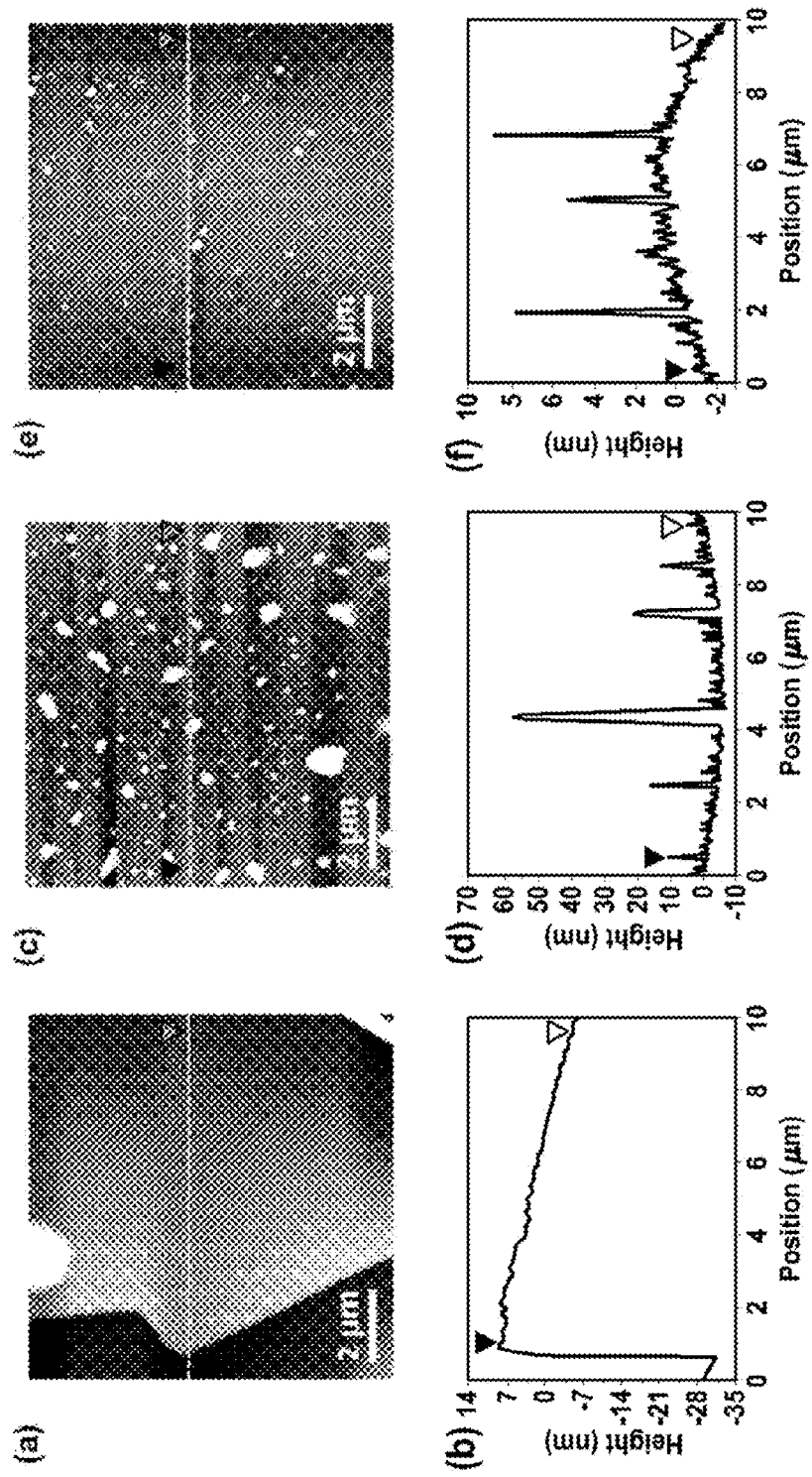
FIG. 5 shows AFM images of Example 1 and graphs showing height profiles extracted from the AFM images.

Referring to FIG. 5, the bare multilayer molybdenum diselenide ($MoSe_2$) film did not show any noticeable topographic changes (FIGS. 5(a) and 5(b)), and the multilayer molybdenum diselenide ($MoSe_2$) thin film after oxygen plasma treatment showed grain features with various diameters (0.12 nm to 0.89 nm) and heights (1 nm to 60 nm) consistent with the development of the amorphous molybdenum oxide ($MoO_x$) layer on the top layer (FIGS. 5(c) and 5(d)). In addition, in the multilayer molybdenum diselenide ($MoSe_2$) thin film after immersion in the aqueous ammonium sulfide solution, particles having a size of 5 nm or less, such as nanostructures, were uniformly distributed on the surface, indicating that the surface properties were changed (FIGS. 5(e) and 5(f)).

Figure 6:
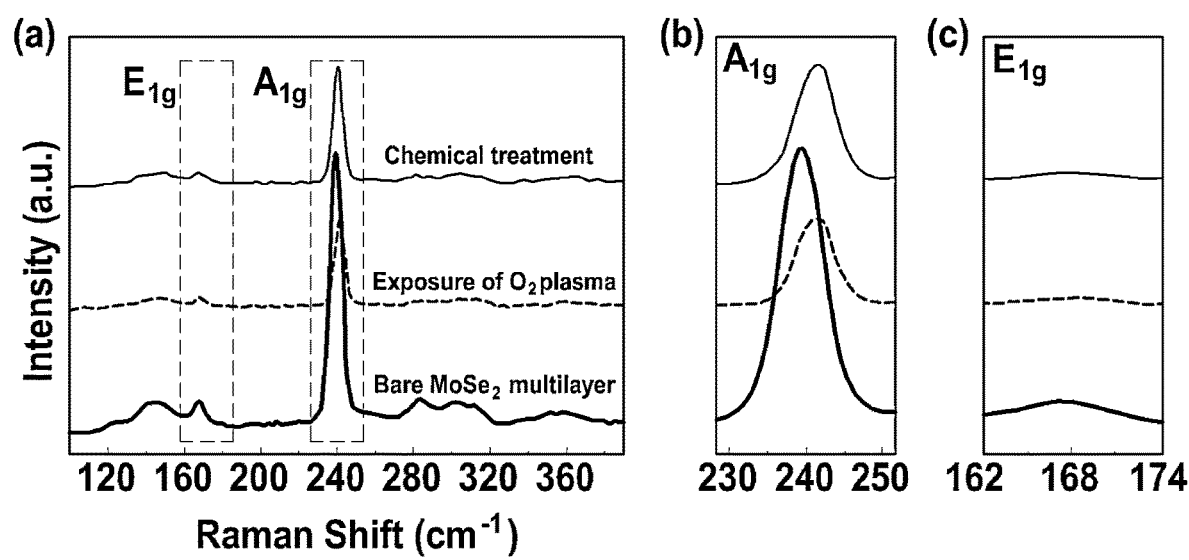
FIG. 6 includes (a) a graph showing the Raman spectra of Example 1, (b) an enlarged graph of $A_{1g}$, and (c) an enlarged graph of $E_{1g}$.

Referring to FIG. 6, the $A_{1g}$ peak of the bare multilayer molybdenum diselenide ($MoSe_2$) thin film was observed at 239.1 $cm^{-1}$ (FIGS. 6(a) and 6(b)), and the $A_{1g}$ peak of the multilayer molybdenum diselenide ($MoSe_2$) thin film after oxygen plasma treatment shifted to 241.8 $cm^{-1}$, and the peak intensity at around 240 $cm^{-1}$ decreased by about 70%, indicating that molybdenum diselenide ($MoSe_2$) with a thickness of several nanometers was chemically transferred to the amorphous molybdenum oxide ($MoO_x$) layer (FIGS. 6(a) and 6(b)). In addition, the $A_{1g}$ peak intensity of the multilayer molybdenum diselenide ($MoSe_2$) thin film after immersion in the aqueous ammonium sulfide solution increased compared to that of the multilayer molybdenum diselenide ($MoSe_2$) thin film after oxygen plasma treatment, but the $A_{1g}$ peak position remained constant, indicating that the surface properties were changed (FIGS. 6(a) and 6(b)).

It can be seen that the $E_{1g}$ peaks of the bare multilayer molybdenum diselenide ($MoSe_2$) thin film, the multilayer molybdenum diselenide ($MoSe_2$) thin film after oxygen plasma treatment, and the multilayer molybdenum diselenide ($MoSe_2$) thin film after treatment by immersion in the aqueous ammonium sulfide solution did not change regardless of the oxidation reaction and reduction reaction (FIG. 6(c)). In addition, it can be seen that the distance between the $A_{1g}$ peak and the $E_{1g}$ peak of the multilayer molybdenum diselenide ($MoSe_2$) thin film after ammonium sulfide treatment was about 74.2 $cm^{-1}$, which is similar to the distance between the $A_{1g}$ peak and the $E_{1g}$ peak of the bare multilayer molybdenum diselenide ($MoSe_2$) thin film, indicating that only the top layer of the initial multilayer molybdenum diselenide ($MoSe_2$) thin film was oxidized by oxygen plasma treatment, so that molybdenum diselenide ($MoSe_2$) existed under the molybdenum oxide ($MoO_x$) layer (FIG. 6(c)).

Example 2: Control of Thickness of Multilayer Transition Metal Dichalcogenide Thin Film 2-1. Fabrication of Multilayer Molybdenum Diselenide ($MoSe_2$) Thin Film Using a Scotch tape method, a multilayer molybdenum diselenide ($MoSe_2$) thin film was formed on a 300-nm-thick silicon oxide ($SiO_2$) substrate thermally growth on a p-type silicon (Si) substrate.

2-2. Oxygen Plasma Treatment of Multilayer Molybdenum Diselenide ($MoSe_2$) Thin Film The multilayer molybdenum diselenide ($MoSe_2$) thin film formed on the silicon oxide ($SiO_2$) substrate was treated with oxygen plasma for about 20 minutes using a plasma generator (PDC-32G-2, Harrick plasma Inc.) under the conditions of power of 10.5 W, chamber pressure of 2.33 Torr, and oxygen flow rate of 60 sccm, thereby forming an amorphous molybdenum oxide ($MoO_x$) layer on the multilayer molybdenum diselenide ($MoSe_2$) thin film.

2-3. First Immersion in Aqueous Ammonium Sulfide (($NH_4)_2S$) Solution

The multilayer molybdenum diselenide ($MoSe_2$) thin film having the amorphous molybdenum oxide ($MoO_x$) layer formed thereon was immersed in an aqueous ammonium sulfide (($NH_4)_2S$) solution (25% concentration) at 323 K for about 30 minutes.

2-4. Second Immersion in Aqueous Ammonium Sulfide (($NH_4)_2S$) Solution

The multilayer molybdenum diselenide ($MoSe_2$) thin film subjected to the first immersion was immersed in an aqueous ammonium sulfide (($NH_4)_2S$) solution (25% concentration) at 323 K for about 1 hour.

2-5. Measurement Results

AFM images, height profiles extracted from the AFM images, and root mean square (RMS) surface roughnesses of the bare multilayer $MoSe_2$ thin film, the multilayer $MoSe_2$ thin film after oxygen plasma treatment, the multilayer $MoSe_2$ thin film after the first immersion in the aqueous ammonium sulfide solution, and the multilayer $MoSe_2$ thin film after the second immersion in the aqueous ammonium sulfide solution were measured and compared.

Figure 7:
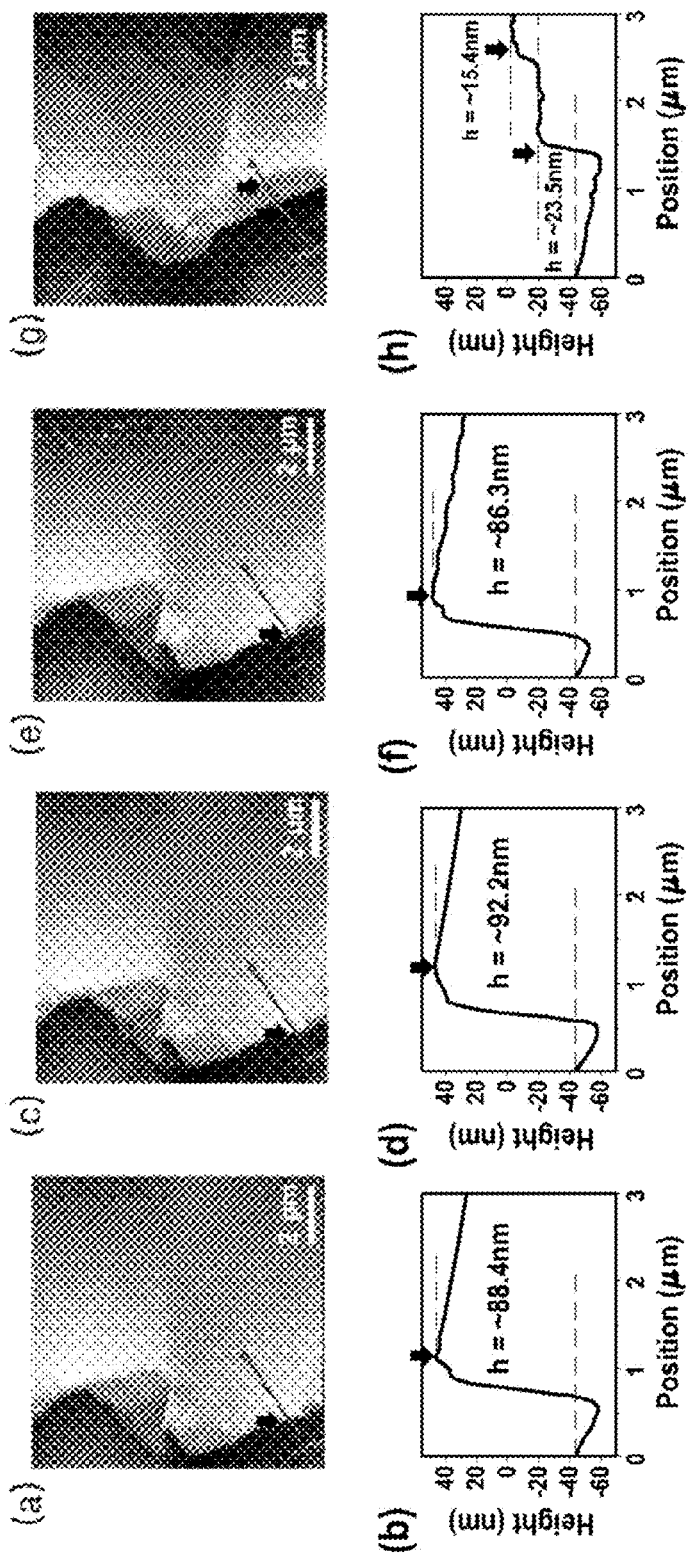
FIG. 7 shows AFM images of Example 2 and graphs showing height profiles extracted from the AFM images.

Referring to FIG. 7, it can be seen that the thickness of the bare multilayer molybdenum diselenide ($MoSe_2$) thin film was about 88.4 nm, but after oxygen plasma treatment, the thickness of the multilayer molybdenum diselenide ($MoSe_2$) thin film increased to about 92.2 nm, indicating that an amorphous molybdenum oxide ($MoO_x$) layer with a thickness of about 3.8 nm was formed (FIGS. 7(a) to 7(d)). It can be seen that, after the first immersion in the aqueous ammonium sulfide solution, the thickness of the multilayer molybdenum diselenide ($MoSe_2$) thin film was reduced to about 86.3 nm, indicating that the amorphous molybdenum oxide ($MoO_x$) layer was completely removed. In addition, after the second immersion in the aqueous ammonium sulfide solution, the thickness of the multilayer molybdenum diselenide ($MoSe_2$) thin film was rapidly reduced to about 38.9 nm, indicating that the thickness of the multilayer molybdenum diselenide ($MoSe_2$) thin film can be controlled depending on the time of the second immersion in the aqueous ammonium sulfide solution (FIGS. 7(e) to 7(h)).

The above-described embodiments of the present invention are merely exemplary, and those skilled in the art will appreciate that the scope of the present invention may include various modifications and equivalents these embodiments.

The invention claimed is:

1. A method for controlling surface properties of a multilayer transition metal dichalcogenide thin film, comprising:
    step (S10) of forming the multilayer transition metal dichalcogenide thin film on a substrate using a transition metal chalcogenide;
    step (S20) of forming an amorphous transition metal oxide thin film on the multilayer transition metal dichalcogenide thin film by allowing oxygen atoms to penetrate into crystals of the multilayer transition metal dichalcogenide thin film; and
    step (S30) of etching a portion of the amorphous transition metal oxide thin film by treating the multilayer transition metal dichalcogenide thin film, which has the amorphous transition metal oxide thin film formed thereon, with an aqueous ammonium sulfide solution,
    wherein, after step S30, the remaining portion of the amorphous transition metal oxide thin film and the multilayer transition metal dichalcogenide thin film form a heterojunction.

2. The method of claim 1, wherein the transition metal chalcogenide in step S10 is any one of molybdenum diselenide ($MoSe_2$), molybdenum disulfide ($MoS_2$), and molybdenum ditelluride ($MoTe_2$).

3. The method of claim 2, wherein the transition metal chalcogenide is molybdenum diselenide ($MoSe_2$).

4. The method of claim 1, wherein, in step S20, the amorphous transition metal oxide thin film is formed by oxidizing the multilayer transition metal dichalcogenide thin film.

5. The method of claim 4, wherein the amorphous transition metal oxide thin film is formed by oxidizing the multilayer transition metal dichalcogenide thin film using an oxygen plasma oxidation method.

6. The method of claim 1, wherein, in step S30, the multilayer transition metal dichalcogenide thin film, which has the amorphous transition metal oxide thin film formed thereon, is immersed in the aqueous ammonium sulfide solution.

7. A method for controlling a thickness of a multilayer transition metal dichalcogenide thin film, comprising:
    step (S100) of forming the multilayer transition metal dichalcogenide thin film on a substrate using a transition metal chalcogenide;
    step (S200) of forming an amorphous transition metal oxide thin film on the multilayer transition metal dichalcogenide thin film by allowing oxygen atoms to penetrate into crystals of the multilayer transition metal dichalcogenide thin film;
    step (S300) of subjecting the multilayer transition metal dichalcogenide thin film, which has the amorphous transition metal oxide thin film formed thereon, to a first treatment with an aqueous ammonium sulfide solution, whereby all of the amorphous transition metal oxide thin film and at least a portion of the multilayer transition metal dichalcogenide thin film are removed, and a portion of oxygen atoms penetrate into crystals of the multilayer transition metal dichalcogenide thin film during the first treatment to form a multilayer transition metal dichalcogenide thin film subjected to the first treatment; and
    step (S400) of subjecting the multilayer transition metal dichalcogenide thin film, subjected to the first treatment, to a second treatment with the aqueous ammonium sulfide solution, thereby removing at least a portion of the multilayer transition metal dichalcogenide thin film subjected to the first treatment.

8. The method of claim 7, wherein the transition metal chalcogenide in step S100 is any one of molybdenum diselenide ($MoSe_2$), molybdenum disulfide ($MoS_2$), and molybdenum ditelluride ($MoTe_2$).

9. The method of claim 8, wherein the transition metal chalcogenide is molybdenum diselenide ($MoSe_2$).

10. The method of claim 7, wherein, in step S200, the amorphous transition metal oxide thin film is formed by oxidizing the multilayer transition metal dichalcogenide thin film.

11. The method of claim 10, wherein the amorphous transition metal oxide thin film is formed by oxidizing the multilayer transition metal dichalcogenide thin film using an oxygen plasma oxidation method.

12. The method of claim 7, wherein, in step S300, the multilayer transition metal dichalcogenide thin film, which has the amorphous transition metal oxide thin film formed thereon, is immersed in the aqueous ammonium sulfide solution.

13. The method of claim 7, wherein, in step S400, the multilayer transition metal dichalcogenide thin film subjected to the first treatment is immersed in the aqueous ammonium sulfide solution.

14. The method of claim 7, wherein the time of the second treatment in step S400 is longer than the time of the first treatment in step S300.

* * * * *